US012096693B2

(12) United States Patent
Singer et al.

(10) Patent No.: US 12,096,693 B2
(45) Date of Patent: Sep. 17, 2024

(54) TEMPERATURE INDICATOR POWERED BY THERMOELECTRIC GENERATOR

(71) Applicant: INTERNATIONAL BUSINESS MACHINES CORPORATION, Armonk, NY (US)

(72) Inventors: Noah Singer, White Plains, NY (US); Marc Henri Coq, Hopewell Junction, NY (US); Dustin Demetriou, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 319 days.

(21) Appl. No.: 17/656,664

(22) Filed: Mar. 28, 2022

(65) Prior Publication Data

US 2023/0309405 A1 Sep. 28, 2023

(51) Int. Cl.
*H01L 35/32* (2006.01)
*E05B 47/00* (2006.01)
*F21S 9/04* (2006.01)
*G08B 5/36* (2006.01)
*G08B 21/18* (2006.01)
*H01L 35/30* (2006.01)
(Continued)

(52) U.S. Cl.
CPC ......... *H10N 10/17* (2023.02); *E05B 47/0001* (2013.01); *F21S 9/04* (2013.01); *G08B 5/36* (2013.01); *G08B 21/182* (2013.01); *H10N 10/13* (2023.02); *E05B 2047/0062* (2013.01); *E05B 2047/0076* (2013.01); *F21Y 2115/10* (2016.08); *H05K 2201/10106* (2013.01)

(58) Field of Classification Search
CPC .. F21Y 2115/10; F21Y 2115/15; F21V 29/54; H10N 10/00; H10N 19/00; H10N 10/17; H10N 10/13; H05K 2201/10106; F25B 21/02; H05B 45/40; F21K 9/00; E05B 47/0001; E05B 2047/0062; E05B 2047/0076; F21S 9/04; G08B 5/36; G08B 21/182
See application file for complete search history.

(56) References Cited

U.S. PATENT DOCUMENTS 7,436,059 B1 * 10/2008 Ouyang .................. H01L 23/34
257/713
10,178,713 B2 * 1/2019 Makosinski ........... H10N 10/17
(Continued)

FOREIGN PATENT DOCUMENTS

| CN | 202546308 U | 11/2009 |
| CN | 208836026 U | 5/2019 |

(Continued)

*Primary Examiner* — Michael A Matey
(74) *Attorney, Agent, or Firm* — Stosch Sabo (57) ABSTRACT

Described are systems for electronic heatsink safety including a system comprising a thermoelectric generator integrated into a heatsink, where the thermoelectric generator includes a first portion exposed to ambient temperature and a second portion contacting the heatsink, and where the thermoelectric generator is configured to produce a current based on a temperature difference between the first portion and the second portion. The system further comprises a first Light Emitting Diode (LED) electrically connected to the thermoelectric generator, where the current is configured to activate the first LED.

18 Claims, 7 Drawing Sheets

(51) Int. Cl.
H10N 10/13 (2023.01)
H10N 10/17 (2023.01)
*F21Y 115/10* (2016.01)

(56) References Cited

U.S. PATENT DOCUMENTS

| | | | | |
|---|---|---|---|---|
| 2003/0110779 A1* | 6/2003 | Otey | ............ | F25B 21/02 |
| | | | | 62/3.2 |
| 2005/0073150 A1* | 4/2005 | Patel | ............ | H10N 10/00 |
| | | | | 290/1 R |
| 2006/0198149 A1* | 9/2006 | Jonsson | ............ | F21V 29/54 |
| | | | | 362/373 |
| 2006/0261470 A1* | 11/2006 | Schick | ............ | H05K 1/0209 |
| | | | | 257/718 |
| 2007/0090737 A1* | 4/2007 | Hu | ............ | F21V 29/56 |
| | | | | 362/800 |
| 2007/0273290 A1* | 11/2007 | Ashdown | ............ | F21V 29/717 |
| | | | | 315/113 |
| 2008/0155990 A1* | 7/2008 | Gupta | ............ | G06F 1/20 |
| | | | | 62/3.2 |
| 2008/0178920 A1* | 7/2008 | Ullo | ............ | H10N 10/852 |
| | | | | 136/238 |
| 2008/0239675 A1* | 10/2008 | Speier | ............ | H01L 23/142 |
| | | | | 361/689 |
| 2008/0266885 A1* | 10/2008 | Sun | ............ | H05K 7/205 |
| | | | | 362/373 |
| 2009/0139244 A1* | 6/2009 | Ullo | ............ | H10N 10/857 |
| | | | | 29/890.03 |
| 2009/0236729 A1* | 9/2009 | Fann | ............ | H01L 23/3735 |
| | | | | 257/E23.079 |
| 2010/0096993 A1* | 4/2010 | Ashdown | ............ | H05B 45/00 |
| | | | | 315/291 |
| 2012/0176803 A1* | 7/2012 | McLennan | ............ | F21V 19/003 |
| | | | | 361/720 |
| 2014/0026933 A1* | 1/2014 | Kell | ............ | H10N 10/17 |
| | | | | 136/205 |
| 2015/0288801 A1* | 10/2015 | Fishman | ............ | H04M 1/0254 |
| | | | | 455/557 |
| 2016/0091559 A1* | 3/2016 | Teoh | ............ | G01R 31/2875 |
| | | | | 324/750.05 |
| 2016/0230978 A1* | 8/2016 | Kato | ............ | F21K 9/232 |
| 2018/0266736 A1* | 9/2018 | Kim | ............ | F25B 21/02 |
| 2018/0351066 A1* | 12/2018 | Rosales | ............ | H10N 10/80 |

FOREIGN PATENT DOCUMENTS

| | | |
|---|---|---|
| CN | 209750673 U | 12/2019 |
| CN | 112912664 A | 6/2021 |
| DE | 603050602 T2 | 10/2006 |
| EP | 2947398 B1 | 3/2017 |
| IN | 201841032897 A | 3/2020 |
| KR | 102013849 B1 | 8/2019 |
| WO | 9111029 W | 7/1991 |
| WO | 0169694 W | 9/2001 |

* cited by examiner

TEMPERATURE INDICATOR POWERED BY THERMOELECTRIC GENERATOR

BACKGROUND

The present disclosure relates to electronic heatsinks, and, more specifically, to safety mechanisms for electronic heatsinks.

Heatsinks are passive heat exchangers that transfer the heat generated by electronic, mechanical, and/or electromechanical devices to a fluid medium (e.g., air, a liquid coolant, etc.) in order to regulate the temperature of the device. In data processing applications, heatsinks can be used to cool Computer Processing Units (CPUs), Graphics Processing Units (GPUs), chipsets, Read-Access Memory (RAM) modules, and/or other components. However, heatsinks and the components around them can be hot enough to cause burns to service technicians or other individuals installing, maintaining, servicing, and/or replacing data processing components (e.g., in a datacenter or high-performance computing laboratory).

SUMMARY

Aspects of the present disclosure are directed toward a system comprising a heatsink disposed on a Computer Processing Unit (CPU), and the CPU disposed on a Printed Circuit Board (PCB), where the heatsink includes at least one heat pipe integrated into a body of the heatsink. The system further comprises a thermoelectric generator integrated into the heatsink, where the thermoelectric generator includes a first portion exposed to ambient temperature and a second portion contacting the at least one heat pipe, where the thermoelectric generator is configured to produce a current based on a temperature difference between the first portion and the second portion. The system further comprises a first Light Emitting Diode (LED) electrically connected to the thermoelectric generator, where the current is configured to activate the first LED.

Further aspects of the present disclosure are directed toward a system comprising a thermoelectric generator integrated into a heatsink, where the thermoelectric generator includes a first portion exposed to ambient temperature and a second portion contacting the heatsink, where the thermoelectric generator is configured to produce a current based on a temperature difference between the first portion and the second portion. The system further comprises a first Light Emitting Diode (LED) electrically connected to the thermoelectric generator, where the current is configured to activate the first LED.

Further aspects of the present disclosure are directed toward a system comprising a thermoelectric generator integrated into a heatsink, where the thermoelectric generator includes a first portion exposed to ambient temperature and a second portion contacting the heatsink, where the thermoelectric generator is configured to produce a current based on a temperature difference between the first portion and the second portion. The system further comprises an electronic lock electrically connected to the thermoelectric generator, where the current is configured to activate the electronic lock.

The present summary is not intended to illustrate each aspect of, every implementation of, and/or every embodiment of the present disclosure.

BRIEF DESCRIPTION OF THE DRAWINGS

The drawings included in the present application are incorporated into and form part of the specification. They illustrate embodiments of the present disclosure and, along with the description, serve to explain the principles of the disclosure. The drawings are only illustrative of certain embodiments and do not limit the disclosure.

While the present disclosure is amenable to various modifications and alternative forms, specifics thereof have been shown by way of example in the drawings and will be described in detail. It should be understood, however, that the intention is not to limit the present disclosure to the particular embodiments described. On the contrary, the intention is to cover all modifications, equivalents, and alternatives falling within the spirit and scope of the present disclosure.

DETAILED DESCRIPTION

Aspects of the present disclosure are directed toward electronic heatsinks, and, more specifically, to safety mechanisms for electronic heatsinks. While not limited to such applications, embodiments of the present disclosure may be better understood in light of the aforementioned context.

Aspects of the present disclosure are directed toward using one or more Thermoelectric Generators (TEGs) integrated into one or more heatsinks to power one or more auxiliary components to improve the safety of the heatsink(s). The TEG can have one portion exposed to the heatsink (e.g., a heat pipe of the heat sink) and another portion exposed to an ambient environment, where the temperature differential between the first portion and the second portion causes the TEG to generate electrical power capable of activating the auxiliary component(s). The one or more auxiliary components can be, for example, LEDs (for indicating the heatsink is hot), electronic locks (for preventing access to the heatsink while it is hot), fans (for accelerating cooling of the heatsink while it is hot), and/or other auxiliary components. In some embodiments, a single TEG is used, while in other embodiments, multiple TEGs are connected together (e.g., in series) within a single heatsink, between multiple heatsinks (e.g., in a server drawer), between multiple server drawers in a server rack, or between multiple server racks in a datacenter. The number of TEGs and/or the configuration of the TEGs can be determined by the power draw of the auxiliary components.

Advantageously, the present disclosure can improve safety by recycling waste heat from the heatsink to power the one or more safety-related auxiliary components. Safety is improved insofar as the one or more auxiliary components can be used to visually indicate a hot surface (e.g., via a LED), physically prevent access to a hot surface (e.g., via an electronic lock), and/or accelerate cooling of a hot surface (e.g., via a fan). As another advantage, aspects of the present disclosure offer high reliability and low maintenance insofar as TEGs utilize no moving parts and can passively generate electricity via temperature differentials for long periods of time before requiring maintenance or replacement. As yet another advantage, aspects of the present disclosure require relatively simple circuitry insofar as the auxiliary components are powered when the heatsink is hot (due to the heightened temperature differential created between the heatsink and the ambient environment) and the auxiliary components receive no power (or limited power) when the heatsink is cool (or warm) due to the decreased temperature differential created between the heatsink and the ambient environment. In other words, aspects of the present disclosure automatically activate when the heatsink is relatively hotter and automatically deactivate when the heatsink is relatively cooler insofar as the power generated by the TEG is a function of the heat differential created by the heatsink relative to the ambient temperature.

Figure 1:
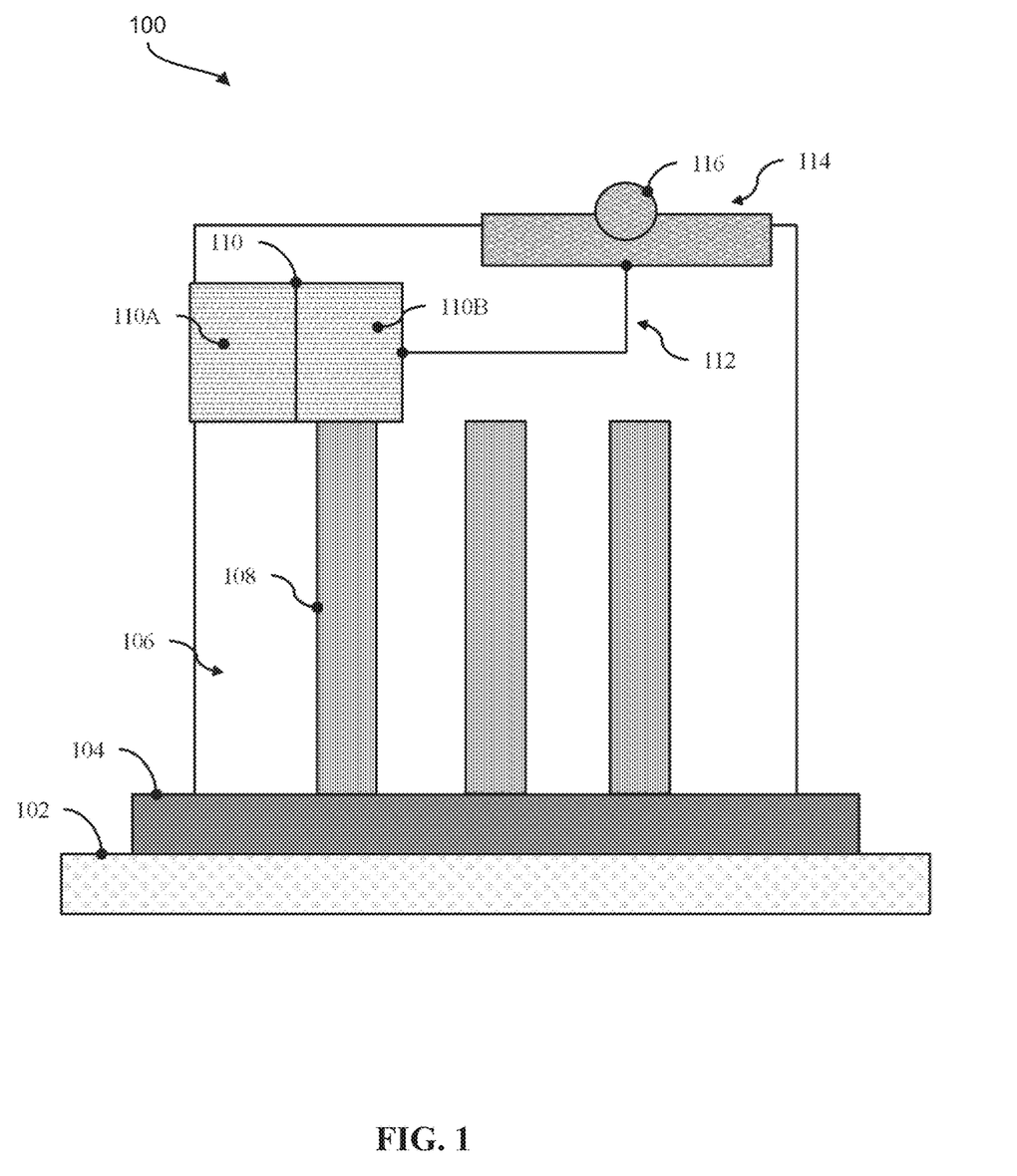
FIG. 1 illustrates a block diagram of an example Thermoelectric Generator (TEG) heatsink safety system with a single Light-Emitting Diode (LED), in accordance with some embodiments of the present disclosure.

Referring now to the figures, FIG. 1 illustrates a block diagram of an example Thermoelectric Generator (TEG) heatsink safety system 100 with a single Light-Emitting Diode (LED) 116, in accordance with some embodiments of the present disclosure. The TEG heatsink safety system 100 includes heatsink 106 disposed on a Computer Processing Unit (CPU) 104 which itself is disposed on a Printed Circuit Board (PCB) 102. The CPU 104 and PCB 102 are examples only, and any other heat-generating data processing system component, or combination of data processing system components, now known or later developed, can be utilized in other embodiments. For example, CPU 104 and/or PCB 102 can alternatively (or additionally) include a Graphics Processing Unit (GPU), a chipset, a memory module (e.g., Read-Access Memory (RAM), Flash memory, etc.), or another computing, networking, or storage component that generates heat as a byproduct of performing data processing operations. Furthermore, in other embodiments, the CPU 104 and/or PCB 102 can be replaced with any other heat-generating component (e.g., outside the field of data processing systems) that may nonetheless benefit from increased safety mechanisms related to surface temperatures. Such other embodiments can include applications in, for example, heavy machinery applications (e.g., construction equipment), industrial applications (e.g., refineries, electrical plants, foundries, etc.), manufacturing applications (e.g., heated molding equipment, machining equipment, etc.), transportation applications (e.g., engines, radiators, etc.), Heating, Ventilation, and Cooling (HVAC) applications (e.g., boilers, stoves, fireplaces, etc.), and/or other applications.

The heatsink 106 can include a heatsink fin stack (not shown for clarity) that can comprise a stack of heat-dissipating fins oriented orthogonal to FIG. 1 (e.g., into and/or out of the page illustrating FIG. 1). Extending through the heatsink fin stack can be one or more heat pipes 108. Heat pipes 108 can refer to heat-transfer devices that utilize phase transition to transfer heat between two solid interfaces. At the hot interface of a heat pipe 108, a volatile liquid in contact with a thermally conductive solid surface can turn into a vapor by absorbing heat from that surface. The vapor can travel through the heat pipe to a cold interface and condense back into a liquid. In this way, the heat pipe 108 can release the latent heat. The liquid can then return to the hot interface through either capillary action, centrifugal force, and/or gravity, and the cycle can repeat. Although three heat pipes 108 are shown in FIG. 1, any number of more or fewer heat pipes 108 can be used in other embodiments.

At least one of the heat pipes 108 can contact a TEG 110. TEG 110 can refer to any thermoelectric generator (also referred to as a Seebeck generator) now known or later developed. TEG 110 can be a solid-state device that converts temperature differences (e.g., heat flux) directly into electrical energy using the Seebeck effect. Advantageously, thermoelectric generators have no moving parts—making them both reliable and scalable into relatively small spaces. TEG 110 can include two thermoelectric materials. The two thermoelectric materials can each have relatively high electrical conductivity and relatively low thermal conductivity in order to form an efficient electrical transport while preserving the temperature difference enabling the electrical transport. Example materials can include bismuth telluride, lead telluride, silicone germanium, calcium manganese oxide, p-doped semiconductors, and n-doped semiconductors. More generally, the two materials of the TEG 110 can exhibit different Seebeck coefficients. TEG 110 can include a first portion 110A exposed to ambient temperature (e.g., a relatively cooler temperature) and a second portion 110B exposed to a relatively higher temperature as a result of its proximity to at least one heat pipe 108.

The TEG 110 can be electrically coupled to an indicator module 114 via a connector 112, where the indicator module 114 includes at least one LED 116. The TEG 110, connector 112, and indicator module 114 can be tuned such that an unsafe temperature (e.g., a relatively higher temperature) generates sufficient current to power the LED 116, whereas a safe temperature (e.g., a relatively lower temperature) does not generate enough current to power the LED 116. Thus, when the LED 116 is on, a service technician or other user can recognize that the example TEG heatsink safety system 100 is not safe to touch, whereas when the LED 116 is off, the service technician or other user can recognize the example TEG heatsink safety system 100 is safe to touch. The TEG 110, connector 112, and/or indicator module 114 can be tuned by, for example, material selection in the TEG 110, sizing of the TEG 110, surface area of the first portion 110A exposed to ambient air, surface area of the second portion 110A exposed to one or more heat pipes 108 (and/or other aspects of heatsink 106), the resistance of connector 112, the power draw of indicator module 114 (e.g., as dictated by a brightness or size of LED 116), and/or other factors.

Indicator module 114 including the LED 116 is non-limiting. Any other component capable of visually indicating at least two different states (e.g., a safe temperature and an unsafe temperature) can be used in other embodiments. LED 116 can be any size, brightness, and/or color LED now known or later developed. Furthermore, LED 116 can alternatively be any light-emitting device other than an LED, now known or later developed. In some embodiments, multiple LEDs 116 can be used (as discussed in more detail hereinafter with respect to FIG. 2).

Figure 2:
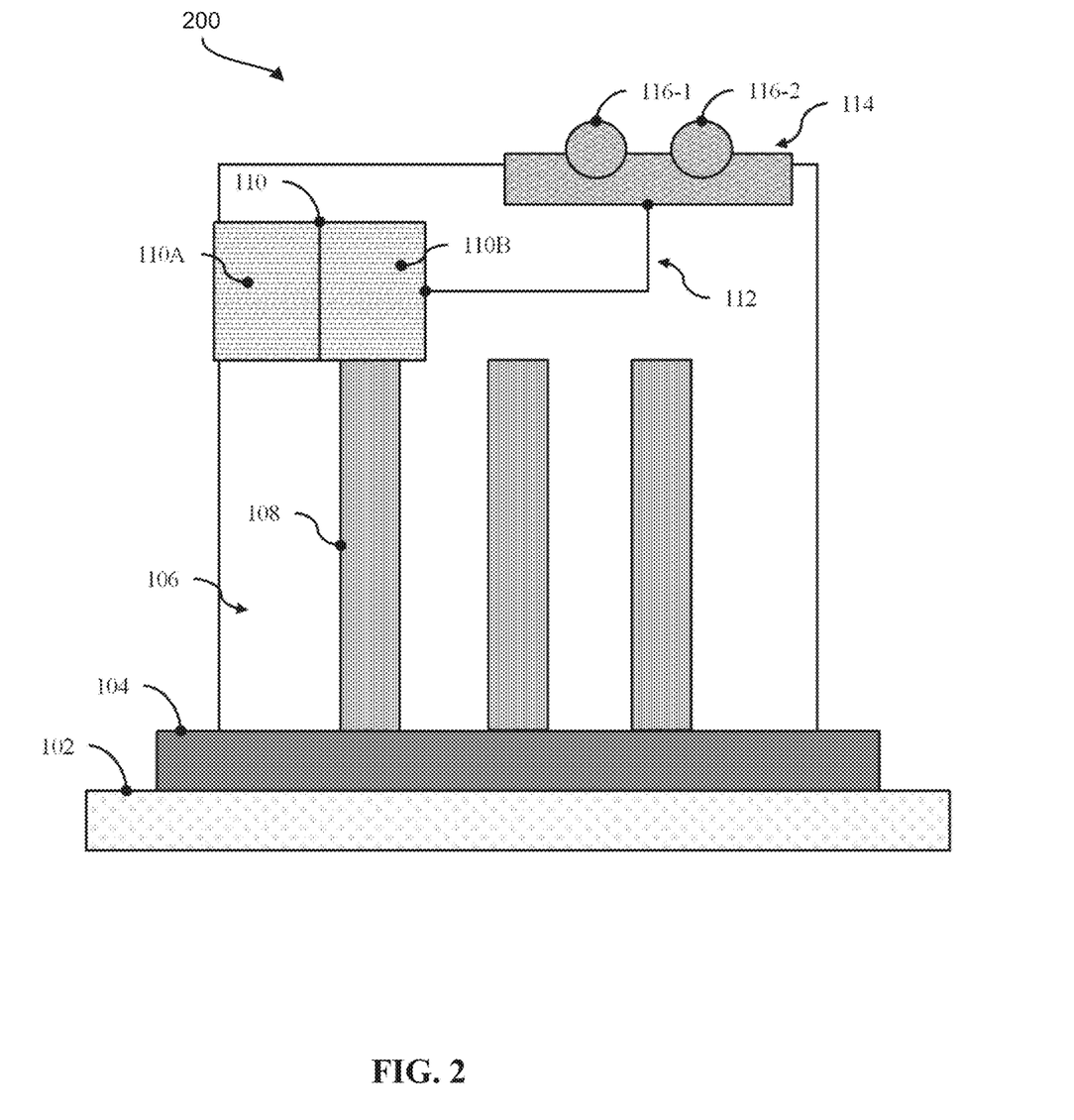
FIG. 2 illustrates a block diagram of an example TEG heatsink safety system with two LEDs, in accordance with some embodiments of the present disclosure.

FIG. 2 illustrates a block diagram of an example TEG heatsink safety system 200 with two LEDs 116, in accordance with some embodiments of the present disclosure. The elements shown in FIG. 2 are consistent with the similarly numbered elements described with respect to FIG. 1. However, FIG. 2 includes two LEDs 116 (e.g., a first LED 116-1 and a second LED 116-2). Multiple LEDs can enable more granular information related to the surface temperature of the heatsink 106 to be conveyed to a service technician or other user.

For example, the indicator module 114 can be configured to light the first LED 116-1 when the current transmitted from the TEG 110 to the indicator module 114 is above a first threshold. The first threshold can imply an unsafe temperature in the heatsink 106 (e.g., a temperature that would likely cause a burn), and the first LED 116-1 can be red to indicate the unsafe temperature, for example. Furthermore, the indicator module 114 can be configured to turn off the first LED 116-1 and turn on the second LED 116-2 when the current transmitted from the TEG 110 is below the first threshold but above a second threshold. The range between the second threshold and the first threshold can indicate an elevated temperature, but not necessarily an unsafe temperature in the heatsink 106. In this example, the second LED 116-2 can be yellow. Finally, when there is an insufficient heat differential in the TEG 110 to generate sufficient current to power either of the LEDs 116, the LEDs 116 can be turned off due to lack of power. Thus, when multiple LEDs 116 are used as is shown in FIG. 2, a service technician or other user can better gauge the underlying temperature of the heatsink 106.

Figure 3:
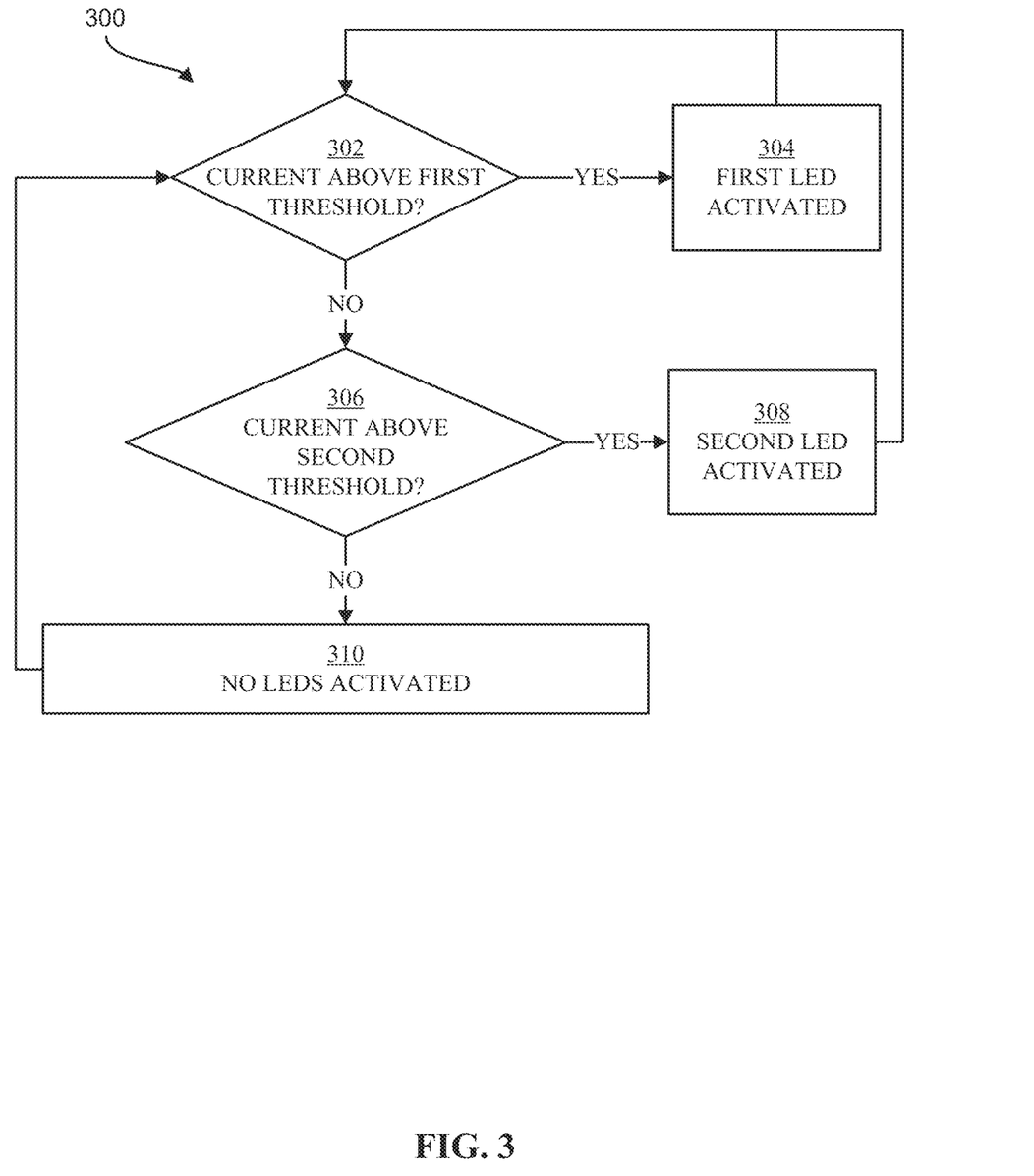
FIG. 3 illustrates a flowchart of an example method for utilizing a TEG and one or more LEDs to indicate a surface temperature of a component in a data processing system, in accordance with some embodiments of the present disclosure.

FIG. 3 illustrates a flowchart of an example method 300 for utilizing a TEG 110 and one or more LEDs 116 to indicate a surface temperature of a component in a data processing system, in accordance with some embodiments of the present disclosure. The method 300 can be implemented by data processing logic incorporated into the indicator module 114 (e.g., a computer 700 as discussed hereafter with respect to FIG. 7), for example.

Operation 302 includes determining if the current generated by the TEG 110 is above a first threshold. Operation 302 can include defining the first threshold of current to be equivalent to an unsafe temperature in the heatsink 106. If so (302: YES), then the method 300 proceeds to operation 304 and activates the first LED 116-1. The method 300 can then iteratively return to operation 302. If not (302: NO), then the method 300 proceeds to operation 306 and determines if the current is below the first threshold and above a second threshold. The second threshold of current can be correlated to a warm, or potentially unsafe temperature in the heatsink 106. In other embodiments, the second threshold of current can be correlated to a minimum current required to power one of the LEDs 116. If so (306: YES), then the method 300 proceeds to operation 308 and activates the second LED 116-2 (and optionally deactivates the first LED 116-1). The method 300 can then iteratively return to operation 302. If not (306: NO), then the heatsink 106 is a safe temperature, and the safe temperature provides an insufficient temperature differential to generate adequate current at the TEG 110 to power the LED 116. Accordingly, in operation 310, no LEDs 116 are activated due to lack of power. The method 300 can then iteratively return to operation 302.

Although the method 300 is described with respect to the first LED 116-1 and the second LED 116-2, a simplified version of the method 300 can also be employed for embodiments including a single LED 116 (e.g., as shown in FIG. 1). Likewise, more complicated versions of the method 300 can be employed for embodiments utilizing more than two LEDs 116.

Figure 4:
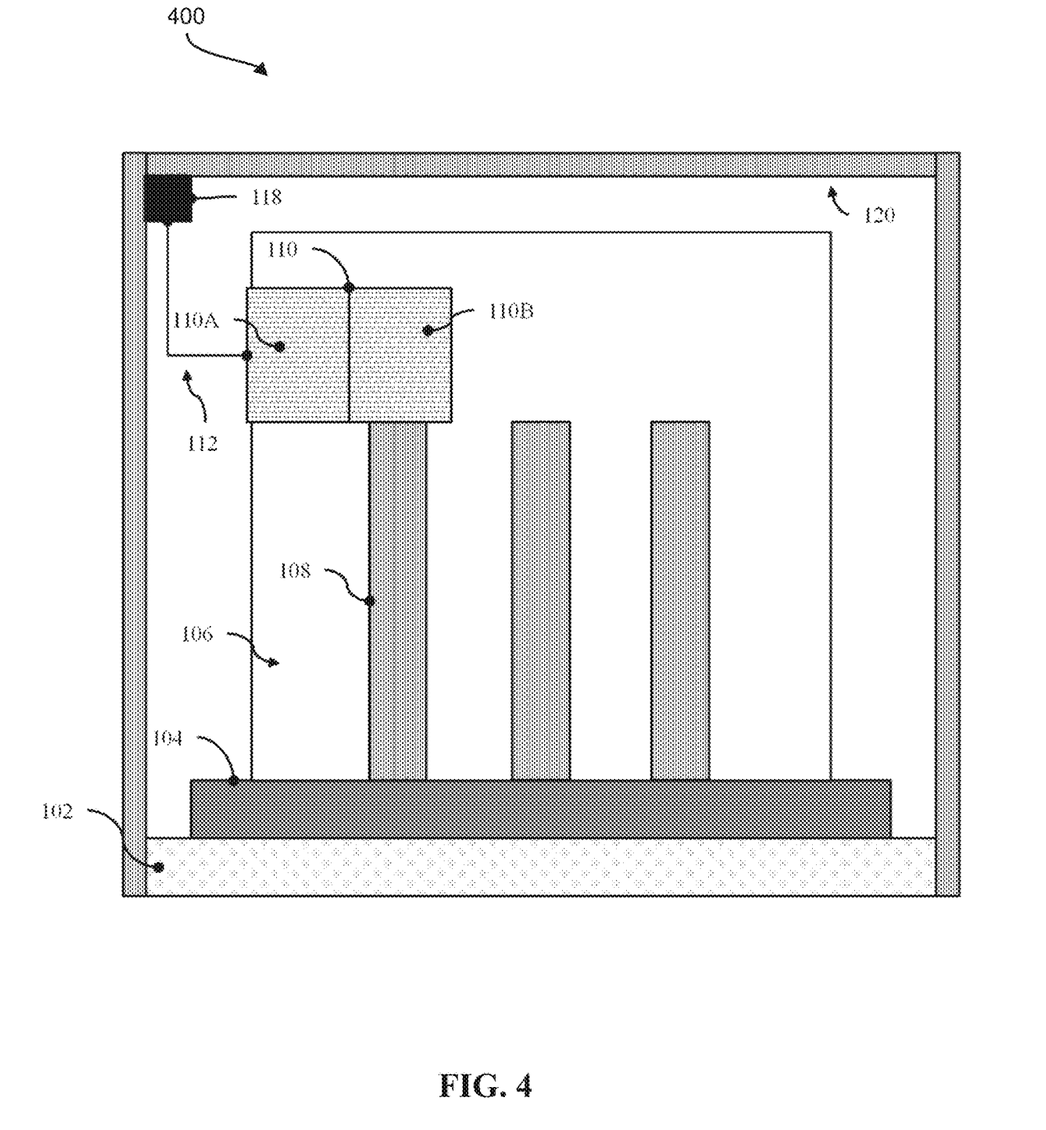
FIG. 4 illustrates a block diagram of an example TEG heatsink safety system with an electronic lock, in accordance with some embodiments of the present disclosure.

FIG. 4 illustrates a block diagram of an example TEG heatsink safety system 400 with an electronic lock 118, in accordance with some embodiments of the present disclosure. The elements shown in FIG. 4 are consistent with the similarly numbered elements described with respect to FIG. 1. However, FIG. 4 includes an electronic lock 118 controlling the ability of a service technician or other user to open an enclosure 120 housing the heatsink 106 and associated components. The electronic lock 118 can be configured to securely fasten the enclosure 120 closed when enough current is generated by the TEG 110 (corresponding to a high enough temperature differential between the heat pipes 108 and ambient air outside of the heatsink 106). The electronic lock 118 can function by any number of mechanisms such as mechanical fastening, electromagnetic fastening, or other fastening techniques that can be activated and deactivated by the presence or absence of electrical power.

The electronic lock 118, connector 112, and TEG 110 can be configured such that the electronic lock 118 unlocks the enclosure 120 when the heatsink 106 is at a relatively safe temperature (e.g., a temperature below a threshold that, in turn, generates a current from the TEG 110 below a threshold). Furthermore, the electronic lock 118, connector 112, and TEG can be tuned such that the electronic lock 118 locks the enclosure when the heatsink 106 is at a relatively unsafe temperature (e.g., a temperature above a threshold that, in turn, generates a current from the TEG 110 above a threshold).

The enclosure 120 can fully or partially isolate the heatsink 106 from a remainder of a rack or server aisle in a datacenter, for example. In some embodiments, the enclosure 120 includes perforations to enable relatively cooler ambient air (e.g., from a cold aisle of a datacenter) to reach the first portion 110A of the TEG 110 despite the barrier introduced by the enclosure 120.

Figure 5:
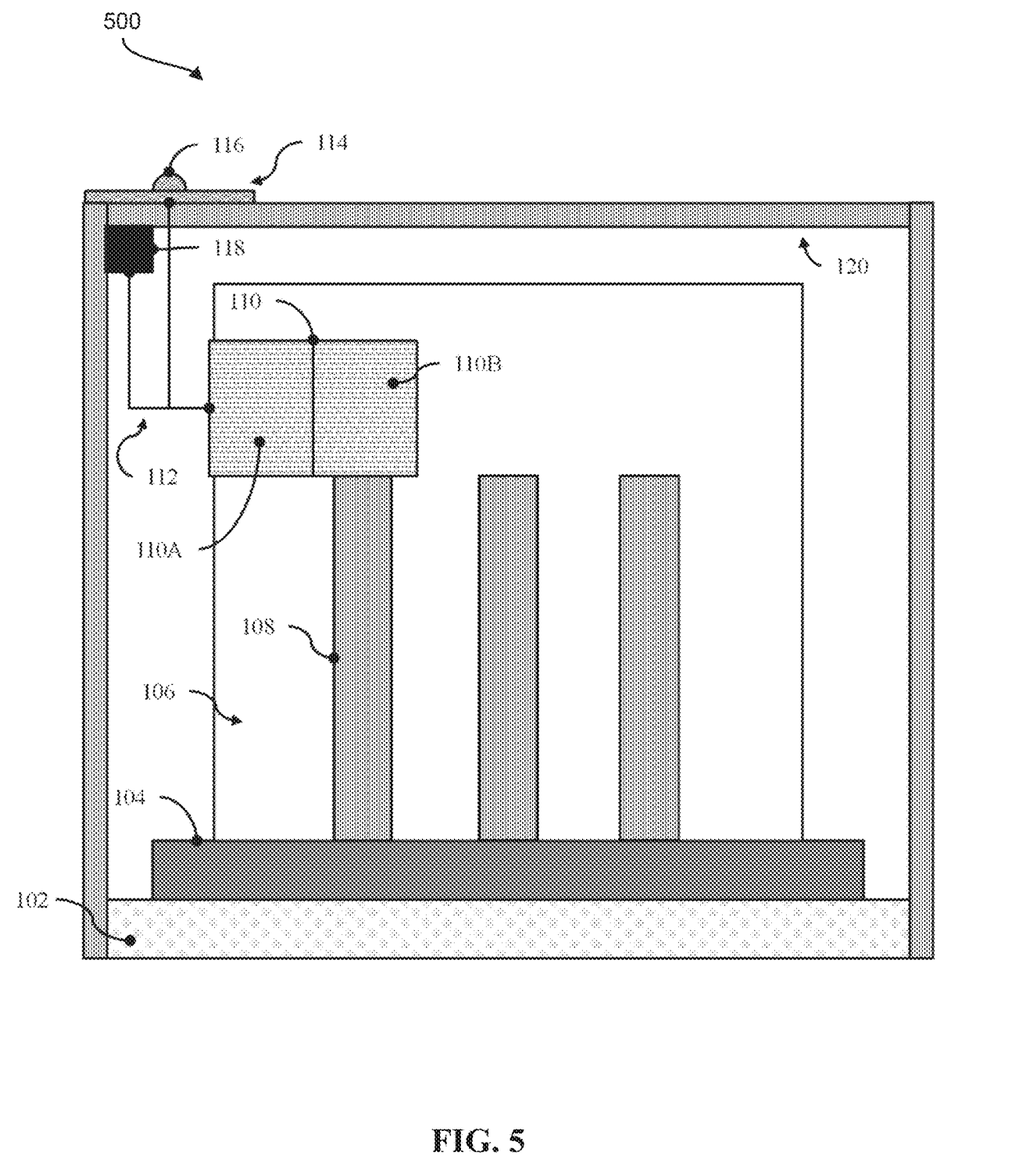
FIG. 5 illustrates a block diagram of an example TEG heatsink safety system with an electronic lock and at least one LED, in accordance with some embodiments of the present disclosure.

FIG. 5 illustrates a block diagram of an example TEG heatsink safety system 500 with an electronic lock 118 and at least one LED 116, in accordance with some embodiments of the present disclosure. The elements shown in FIG. 5 are consistent with the similarly numbered elements described with respect to FIG. 1. However, FIG. 5 includes both an electronic lock 118 and an indicator module 114 with LED 116. Although FIG. 5 illustrates an indicator module 114 with a single LED 116, in other embodiments, the indicator module 114 can include multiple LEDs 116 (e.g., see FIG. 2).

Advantageously, the combination of electronic lock 118 and LED 116 illustrated in FIG. 5 can enable both a visual warning (via LED 116) and a physical lockout (via electronic lock 118) as may be warranted by the temperature of the heatsink 106. For example, when the heatsink 106 is at an unsafe temperature, the TEG 110 can generate enough current to activate the electronic lock 118 to secure the enclosure 120. In some embodiments, at such a temperature, the TEG 110 may also generate enough excess current to power at least one LED 116. However, once the temperature falls to a warm temperature, the TEG 110 may generate insufficient current to power the electronic lock 118, but enough current to power the LED 116. In this way, aspects of the present disclosure can still warn (e.g., via LED 116) a service technician or user that a heatsink 106 has an elevated temperature even if the heatsink 106 is not hot enough to cause the TEG 110 to generate enough current to activate the electronic lock 118.

Figure 6:
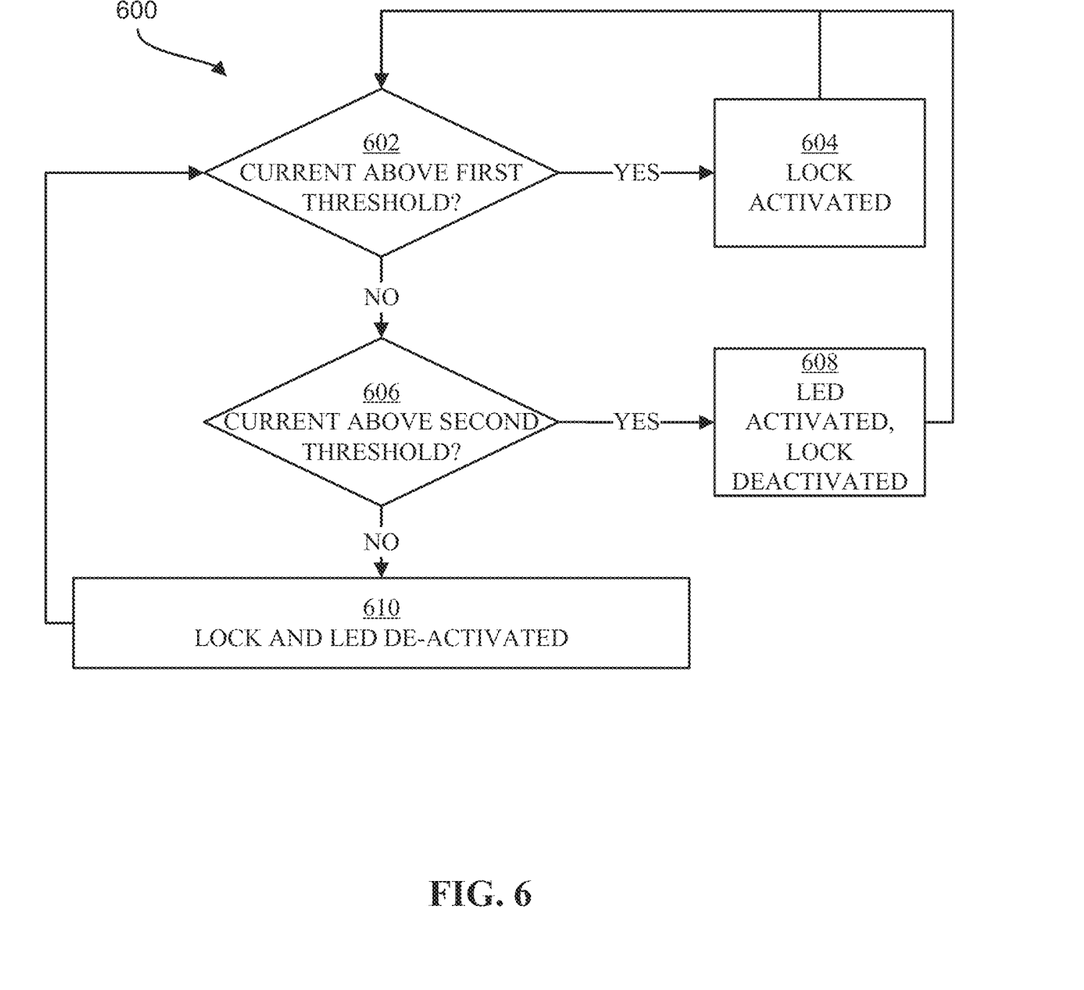
FIG. 6 illustrates a flowchart of an example method for utilizing a TEG, and electronic lock, and one or more LEDs to indicate a surface temperature of a component in a data processing system, in accordance with some embodiments of the present disclosure.

FIG. 6 illustrates a flowchart of an example method 600 for utilizing a TEG 110, an electronic lock 118, and one or more LEDs 116 to indicate a surface temperature of a component in a data processing system, in accordance with some embodiments of the present disclosure. The method 600 can be implemented by data processing logic stored in an indicator module 114 and/or an electronic lock 118 (e.g., such as computer 700 of FIG. 7 described hereafter), for example.

Operation 602 includes determining whether a current from the TEG 110 is above a first threshold. The first threshold can be consistent with the first threshold discussed in operation 302 of FIG. 3. If so (602: YES), the method 600 proceeds to operation 604 and activates the electronic lock 118 in order to secure the enclosure 120 from access while the heatsink 106 is hot. The method 600 then iteratively returns to operation 602. If not (602: NO), then the method 600 proceeds to operation 606 and determines if the current generated by the TEG 110 is above a second threshold. The second threshold can be consistent with the second threshold discussed with respect to operation 306 of FIG. 3 (e.g., indicating a warm, or possibly dangerous temperature). If so (606: YES), then the method 600 proceeds to operation 608 and activates the LED 116 and deactivates the electronic lock 118. In this example, when the current generated by the temperature differential is between the second threshold and the first threshold, there may be insufficient current to activate both the electronic lock 118 and the LED 116. Accordingly, by deactivating the electronic lock 118 and activating the LED 116 in operation 608, aspects of the present disclosure can exchange a physical lockout (via the electronic lock 118) for a visual warning (via the LED 116) for heatsink 106 temperatures that may be above ambient temperature but are unlikely to be immediately dangerous. After performing operation 608, the method 600 can iteratively return to operation 602.

Referring back to operation 606, if the current is not above the second threshold (606: NO), then the method 600 can proceed to operation 610 where both the electronic lock 118 and the LED 116 are deactivated (e.g., via a switch electrically coupled to the TEG 110, electronic LED 116, and electronic lock 118) due to lack of power (corresponding to a lack of any significantly heightened temperature in the heatsink 106). The method 600 can then iteratively return to operation 602.

Although FIG. 6 is described with respect to an embodiment including both an electronic lock 118 and a single LED 116 (as shown in FIG. 5), a simplified version of the method 600 can also be employed for an embodiment including only a single electronic lock 118 (e.g., as shown in FIG. 4), for example. Furthermore, the method 600 can be expanded to accommodate embodiments including multiple electronic locks 118 and/or multiple LEDs 116.

As will be appreciated by one skilled in the art, the dimensions shown in the drawings, whether absolute or relative, are not necessarily to scale. Furthermore, the configurations shown in the drawings and described in the specification are intended to be representative of some embodiments and are simplified for ease of discussion. In other embodiments, other arrangements are possible. For example, in reference to FIGS. 1-6, a single TEG 110 has been discussed, however, in other embodiments, a plurality of TEGs 110 can be connected together (e.g., in series) to generate larger amounts of power. Such connections of numerous TEGs 110 can occur within a same component (e.g., heatsink 106, PCB 102, CPU 104, etc.) or connecting numerous components together (e.g., within a server drawer, between server drawers, or even between server racks in a datacenter).

Furthermore, although LEDs 116 and electronic locks 118 are primarily discussed, other electrically actuated components are also within the spirit and scope of the present disclosure. As one example, a variable speed fan can be connected to the TEG 110 such that the variable speed fan operates at increasing speeds corresponding to increasing temperature differentials. In this way, the waste heat exhausted from the heatsink 106 can be repurposed to accelerate cooling of the data processing system components (e.g., PCB 102, CPU 104, etc.).

Figure 7:
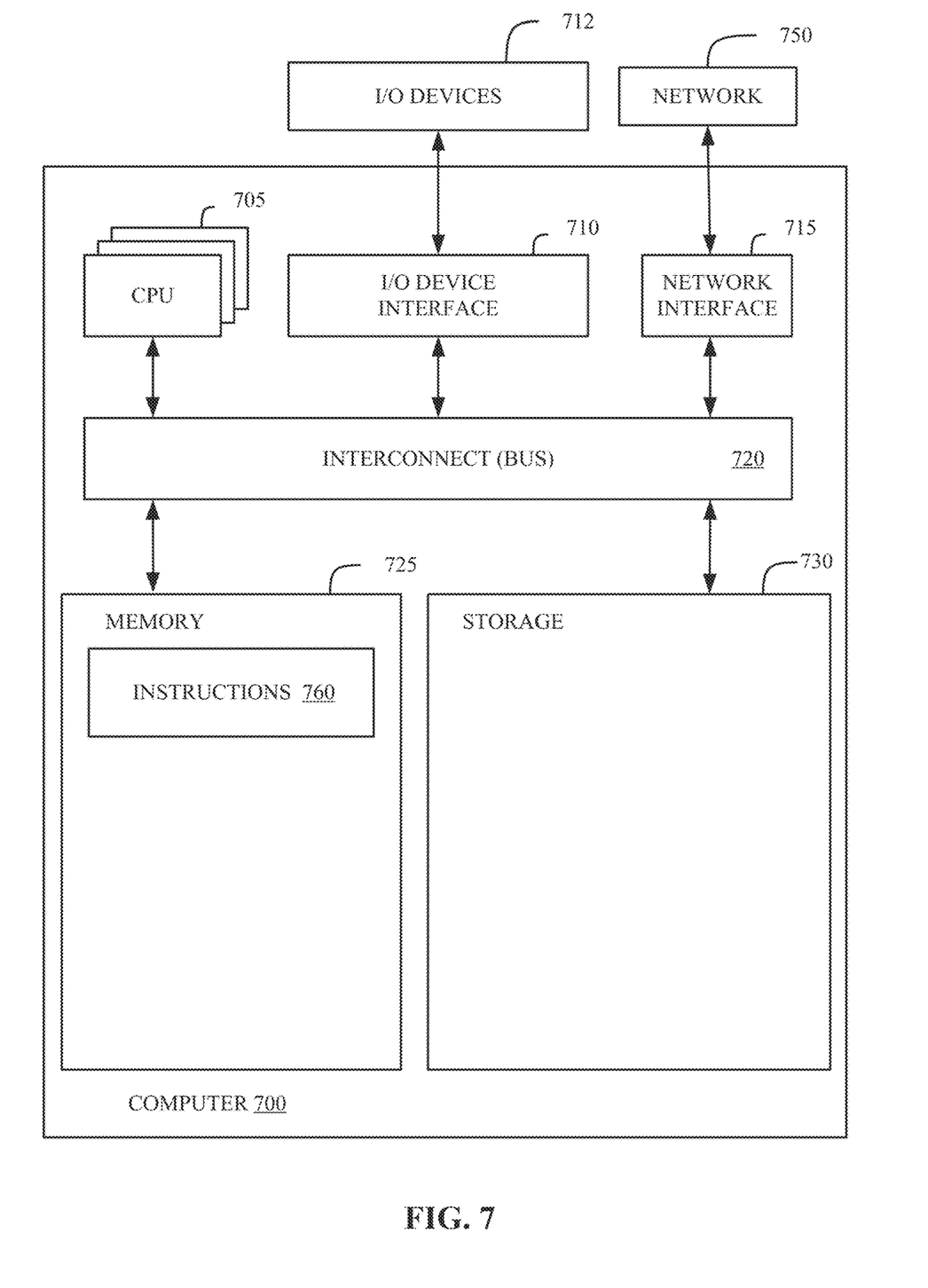
FIG. 7 illustrates a block diagram of an example computer that can implement various methods, modules, and/or functionalities discussed herein using a combination of software and hardware, in accordance with embodiments of the present disclosure.

FIG. 7 illustrates a block diagram of an example computer 700 in accordance with some embodiments of the present disclosure. In various embodiments, computer 700 can perform any or all portions of the methods described in FIGS. 3 and 6 and/or implement the functionality discussed in FIGS. 1-2 and/or 4-5. In some embodiments, computer 700 receives instructions related to the aforementioned methods and functionalities by downloading processor-executable instructions from a remote data processing system via network 750. In other embodiments, computer 700 provides instructions for the aforementioned methods and/or functionalities to a client machine (e.g., indicator module 114 and/or electronic lock 118) such that the client machine executes the method, or a portion of the method, based on the instructions provided by computer 700. In some embodiments, the computer 700 is incorporated into (or functionality similar to computer 700 is virtually provisioned to) one or more entities illustrated in the drawings.

Computer 700 includes memory 725, storage 730, interconnect 720 (e.g., a bus), one or more CPUs 705 (also referred to as processors herein), I/O device interface 710, I/O devices 712, and network interface 715.

Each CPU 705 retrieves and executes programming instructions stored in memory 725 or storage 730. Interconnect 720 is used to move data, such as programming instructions, between the CPUs 705, I/O device interface 710, storage 730, network interface 715, and memory 725. Interconnect 720 can be implemented using one or more buses. CPUs 705 can be a single CPU, multiple CPUs, or a single CPU having multiple processing cores in various embodiments. In some embodiments, CPU 705 can be a digital signal processor (DSP). In some embodiments, CPU 705 includes one or more 3D integrated circuits (3DICs) (e.g., 3D wafer-level packaging (3DWLP), 3D interposer based integration, 3D stacked ICs (3D-SICs), monolithic 3D ICs, 3D heterogeneous integration, 3D system in package (3DSiP), and/or package on package (PoP) CPU configurations). Memory 725 is generally included to be representative of a random-access memory (e.g., static random-access memory (SRAM), dynamic random-access memory (DRAM), or Flash). Storage 730 is generally included to be representative of a non-volatile memory, such as a hard disk drive, solid state device (SSD), removable memory cards, optical storage, or flash memory devices. In an alternative embodiment, storage 730 can be replaced by storage area-network (SAN) devices, the cloud, or other devices connected to computer 700 via I/O device interface 710 or network 750 via network interface 715.

In some embodiments, memory 725 stores instructions 760. However, in various embodiments, instructions 760 are stored partially in memory 725 and partially in storage 730, or they are stored entirely in memory 725 or entirely in storage 730, or they are accessed over network 750 via network interface 715.

Instructions 760 can be computer-readable and computer-executable instructions for performing any portion of, or all of, the methods of FIGS. 3 and/or 6 and/or implementing the functionality discussed in FIGS. 1-2 and/or 4-5. Although instructions 760 are shown in memory 725, instructions 760 can include program instructions collectively stored across numerous computer-readable storage media and executable by one or more CPUs 705.

In various embodiments, I/O devices 712 include an interface capable of presenting information and receiving input. For example, I/O devices 712 can present information to a user interacting with computer 700 and receive input from the user.

Computer 700 is connected to network 750 via network interface 715. Network 750 can comprise a physical, wireless, cellular, or different network.

Embodiments of the present invention can be a system, a method, and/or a computer program product at any possible technical detail level of integration. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or subset of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments can be practiced. These embodiments were described in sufficient detail to enable those skilled in the art to practice the embodiments, but other embodiments can be used and logical, mechanical, electrical, and other changes can be made without departing from the scope of the various embodiments. In the previous description, numerous specific details were set forth to provide a thorough understanding the various embodiments. But the various embodiments can be practiced without these specific details. In other instances, well-known circuits, structures, and techniques have not been shown in detail in order not to obscure embodiments.

Different instances of the word "embodiment" as used within this specification do not necessarily refer to the same embodiment, but they can. Any data and data structures illustrated or described herein are examples only, and in other embodiments, different amounts of data, types of data, fields, numbers and types of fields, field names, numbers and types of rows, records, entries, or organizations of data can be used. In addition, any data can be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

Any advantages discussed in the present disclosure are example advantages, and embodiments of the present disclosure can exist that realize all, some, or none of any of the discussed advantages while remaining within the spirit and scope of the present disclosure.

A non-limiting list of examples are provided hereinafter to demonstrate some aspects of the present disclosure. Example 1 is a system comprising: a heatsink disposed on a Computer Processing Unit (CPU), and the CPU disposed on a Printed Circuit Board (PCB), wherein the heatsink includes at least one heat pipe integrated into a body of the heatsink; a thermoelectric generator integrated into the heatsink, wherein the thermoelectric generator includes a first portion exposed to ambient temperature and a second portion contacting the at least one heat pipe, wherein the thermoelectric generator is configured to produce a current based on a temperature difference between the first portion and the second portion; and a first Light Emitting Diode (LED) electrically connected to the thermoelectric generator, wherein the current is configured to activate the first LED.

Example 2 includes the features of Example 1, including or excluding optional features. Example 2 further comprises: a second LED, wherein the second LED is configured to operate at a lower current threshold than the first LED. Optionally, the first LED is configured to deactivate in response to the current falling below an upper current threshold, and wherein the second LED is configured to activate in response to the current remaining between the lower current threshold and the upper current threshold. Optionally, the first LED and the second LED provide a safety-related indication of surface temperature of the heatsink.

Example 3 includes the features of any one of Examples 1 to 2, including on excluding optional features. Example 3 further comprises: an electronic lock, wherein the current is configured to activate the electronic lock. Optionally, Example 3 further comprises: an access panel providing access to the CPU, the PCB, and the heatsink, wherein the electronic lock is disposed on the access panel. Optionally, when activated, the electronic lock is configured to prevent access to the CPU, the PCB, and the heatsink by locking the access panel.

Example 4 includes the features of any one of Examples 1 to 3, including or excluding optional features. In this example, the thermoelectric generator comprises a first material adjacent to a second material and between the first portion and the second portion. Optionally, the first material and the second material have different Seebeck coefficients. Optionally, the first material is a p-doped semiconductor, and wherein the second material is an n-doped semiconductor.

Example 5 is a system comprising: a thermoelectric generator integrated into a heatsink, wherein the thermoelectric generator includes a first portion exposed to ambient temperature and a second portion contacting the heatsink, wherein the thermoelectric generator is configured to produce a current based on a temperature difference between the first portion and the second portion; and a first Light Emitting Diode (LED) electrically connected to the thermoelectric generator, wherein the current is configured to activate the first LED.

Example 6 includes the features of Example 5, including or excluding optional features. Example 6 further comprises a second LED, wherein the second LED is configured to operate at a lower current threshold than the first LED. Optionally, the first LED is configured to deactivate in response to the current falling below an upper current threshold, and wherein the second LED is configured to activate in response to the current remaining between the lower current threshold and the upper current threshold. Optionally, the first LED and the second LED provide a safety-related indication of surface temperature of the heatsink.

Example 7 includes the features of any one of Examples 5 to 6, including or excluding optional features. In this example, the thermoelectric generator comprises a first material adjacent to a second material and between the first portion and the second portion. Optionally, the first material and the second material have different Seebeck coefficients. Optionally, the first material is a p-doped semiconductor, and wherein the second material is an n-doped semiconductor.

Example 8 is a system comprising a thermoelectric generator integrated into a heatsink, wherein the thermoelectric generator includes a first portion exposed to ambient temperature and a second portion contacting the heatsink, wherein the thermoelectric generator is configured to produce a current based on a temperature difference between the first portion and the second portion; and an electronic lock electrically connected to the thermoelectric generator, wherein the current is configured to activate the electronic lock.

Example 9 includes the features of Example 8, including or excluding optional features. Example 9 further comprises an access panel providing access to the heatsink, wherein the electronic lock is disposed on the access panel, and wherein, when activated, the electronic lock is configured to prevent access to the heatsink by locking the access panel.

Example 10 includes the features of any one of Examples 8 to 9, including or excluding optional features. In this example, the thermoelectric generator comprises a first material adjacent to a second material and between the first portion and the second portion, and wherein the first material and the second material have different Seebeck coefficients.

What is claimed is:

1. A system comprising:
    a heatsink disposed on a Computer Processing Unit (CPU), and the CPU disposed on a Printed Circuit Board (PCB), wherein the heatsink includes at least one heat pipe integrated into a body of the heatsink;
    a thermoelectric generator integrated into the heatsink, wherein the thermoelectric generator includes a first portion exposed to ambient temperature and a second portion contacting the at least one heat pipe, wherein the thermoelectric generator is configured to produce a current based on a temperature difference between the first portion and the second portion;
    a first Light Emitting Diode (LED), wherein the first LED is configured to operate when the current satisfies a first current threshold; and
    a second LED, wherein the second LED is configured to operate when the current satisfies a second current threshold.

2. The system of claim 1, wherein the first LED is configured to deactivate in response to the current falling below the first current threshold, and wherein the second LED is configured to deactivate in response to the current falling below the second current threshold.

3. The system of claim 2, wherein the first LED and the second LED provide a safety-related indication of surface temperature of the heatsink.

4. The system of claim 1, further comprising:
    an electronic lock, wherein the current is configured to activate the electronic lock.

5. The system of claim 4, further comprising:
    an access panel providing access to the CPU, the PCB, and the heatsink, wherein the electronic lock is disposed on the access panel.

6. The system of claim 5, wherein, when activated, the electronic lock is configured to prevent access to the CPU, the PCB, and the heatsink by locking the access panel.

7. The system of claim 1, wherein the thermoelectric generator comprises a first material adjacent to a second material and between the first portion and the second portion.

8. The system of claim 7, wherein the first material and the second material have different Seebeck coefficients.

9. The system of claim 7, wherein the first material is a p-doped semiconductor, and wherein the second material is an n-doped semiconductor.

10. A system comprising:
    a thermoelectric generator integrated into a heatsink, wherein the thermoelectric generator includes a first portion exposed to ambient temperature and a second portion contacting the heatsink, wherein the thermoelectric generator is configured to produce a current based on a temperature difference between the first portion and the second portion;
    a first Light Emitting Diode (LED), wherein the first LED is configured to operate when the current satisfies a first current threshold; and
    a second LED, wherein the second LED is configured to operate when the current satisfies a second current threshold.

11. The system of claim 10, wherein the first LED is configured to deactivate in response to the current falling below the first current threshold, and wherein the second LED is configured to deactivate in response to the current falling below the second current threshold.

12. The system of claim 11, wherein the first LED and the second LED provide a safety-related indication of surface temperature of the heatsink.

13. The system of claim 10, wherein the thermoelectric generator comprises a first material adjacent to a second material and between the first portion and the second portion.

14. The system of claim 13, wherein the first material and the second material have different Seebeck coefficients.

15. The system of claim 13, wherein the first material is a p-doped semiconductor, and wherein the second material is an n-doped semiconductor.

16. A system comprising:
    a thermoelectric generator integrated into a heatsink, wherein the thermoelectric generator includes a first portion exposed to ambient temperature and a second portion contacting the heatsink, wherein the thermoelectric generator is configured to produce a current based on a temperature difference between the first portion and the second portion; and
    an electronic lock electrically connected to the thermoelectric generator, wherein the current is configured to activate the electronic lock.

17. The system of claim 16, further comprising:
    an access panel providing access to the heatsink, wherein the electronic lock is disposed on the access panel, and wherein, when activated, the electronic lock is configured to prevent access to the heatsink by locking the access panel.

18. The system of claim 16, wherein the thermoelectric generator comprises a first material adjacent to a second material and between the first portion and the second portion, and wherein the first material and the second material have different Seebeck coefficients.

\* \* \* \* \*